(12) United States Patent
Mizuno et al.

(10) Patent No.: US 7,850,752 B2
(45) Date of Patent: Dec. 14, 2010

(54) SEMICONDUCTOR MANUFACTURING SYSTEM AND METHOD OF MANUFACTURING SEMICONDUCTOR DEVICE

(75) Inventors: Ayako Mizuno, Yokohama (JP); Hiroshi Tomita, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 409 days.

(21) Appl. No.: 12/017,656

(22) Filed: Jan. 22, 2008

(65) Prior Publication Data

US 2008/0182429 A1    Jul. 31, 2008

(30) Foreign Application Priority Data

Jan. 23, 2007    (JP) .............................. 2007-012912

(51) Int. Cl.
*B01D 50/00* (2006.01)
(52) U.S. Cl. .................... 55/385.2; 96/135; 454/187
(58) Field of Classification Search ............... 55/385.2; 96/135, 224; 438/787; 454/187
See application file for complete search history.

(56) References Cited

U.S. PATENT DOCUMENTS 7,141,221 B2 * 11/2006 Irie et al. .................... 422/172

2006/0117722 A1    6/2006 Kuo et al.

FOREIGN PATENT DOCUMENTS

JP    9-145112    6/1997

* cited by examiner

*Primary Examiner*—Robert A Hopkins
(74) *Attorney, Agent, or Firm*—Finnegan, Henderson, Farabow, Garrett & Dunner, L.L.P.

(57) ABSTRACT

A semiconductor manufacturing system, having a filter that is disposed in a clean room and removes an organic solvent containing siloxane from a gas supplied from the outside of said clean room; a first semiconductor manufacturing apparatus that is disposed in said clean room and uses light in an atmosphere containing the gas having passed through said filter; a second semiconductor manufacturing apparatus that is disposed in said clean room and has an exhaust gas outlet for discharging a gas containing an organic solvent containing siloxane; and a removing device that is disposed at said exhaust gas outlet of said second semiconductor manufacturing apparatus, filters out the organic solvent containing siloxane from the exhaust gas output from said exhaust gas outlet, and discharges the filtered gas into an exhaust gas duct for discharging the exhaust gas to the outside of said clean room.

7 Claims, 3 Drawing Sheets

SEMICONDUCTOR MANUFACTURING SYSTEM AND METHOD OF MANUFACTURING SEMICONDUCTOR DEVICE

CROSS-REFERENCE TO RELATED APPLICATION

This application is based upon and claims the benefit of priority from the prior Japanese Patent Application No. 2007-012912, filed on Jan. 23, 2007, the entire contents of which are incorporated herein by reference.

BACKGROUND OF THE INVENTION

1. Field of the Invention

The present invention relates to a semiconductor manufacturing system for treating exhaust gas containing an organic solvent, and a method of manufacturing a semiconductor device.

2. Background Art

During use of a conventional aligner that irradiates a semiconductor wafer with ultraviolet light or the like or a conventional inspection apparatus using light, siloxane in the atmosphere can adhere to a lens, a mirror or the like in the optical system, and $SiO_2$ can be deposited, resulting in the so-called "haze". The "haze" is disadvantageous because the aligner or the inspection apparatus is deteriorated in illuminance.

For example, hexadimethyldisilazane (HMDS) used in the lithography process is decomposed into ammonia and trimethylsilanol (TMS) (formula (1)), so that a low-molecular-weight siloxane is produced. An organic solvent or the like containing the low-molecular-weight siloxane and other kinds of siloxane becomes a cause of illuminance deterioration of the aligner and the inspection apparatus.

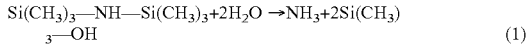

$$Si(CH_3)_3-NH-Si(CH_3)_3+2H_2O \rightarrow NH_3+2Si(CH_3)_3-OH \quad (1)$$

HMDS is used for a resist applying apparatus. The exhaust gas from the resist applying apparatus is fed to the scrubber of the building through the exhaust gas duct of the clean room and treated by the scrubber before being discharged to the outside.

However, the scrubber used for the entire clean room has a low removal efficiency because the amount of exhaust gas is high. Specifically, the TMS concentration at the exhaust gas outlet of the scrubber is on the order of several hundreds to several thousands ppb. The gas containing the remaining TMS is taken in and supplied into the clean room or to the aligner or the like in the clean room through the outside air inlet of the clean room.

The aligner or the like, which can be affected by TMS, has an activated carbon filter for removing TMS at the air inlet thereof. However, the outside air conditioner of the clean room removes TMS at a low removal efficiency because the flow rate to be processed is high. Thus, there is a problem that the life of the activated carbon filter is extremely short, the frequency of filter replacement is high, and therefore, the availability ratio of the aligner is low.

There has been proposed a semiconductor manufacturing apparatus (resist applying apparatus) that has a temperature/humidity adjusting unit that feeds air after adjusting the temperature and humidity thereof and treats a substrate with an organic solvent while flowing the adjusted air supplied from the temperature/humidity adjusting unit from an upper part of the apparatus (see Japanese Patent Laid-Open Publication No. 9-145112, for example).

The semiconductor manufacturing apparatus is sealed with a cover or the like covering the perimeter thereof, collects the adjusted air supplied from the temperature/humidity adjusting unit through a collecting port in the bottom of the cover with collecting means composed of an intake fan, piping and the like, and supplies the adjusted air to an adjustment part in the temperature/humidity adjusting unit to make the adjusted air circulate. Furthermore, the semiconductor manufacturing apparatus removes the organic solvent or particles in the collected adjusted air with an organic solvent removing part or a particle removing filter.

The arrangement described above can suppress corrosion of parts located in lower portions of the semiconductor manufacturing apparatus or an adverse effect on the human body, reduce the running cost, and reduce the turbulent flow between the apparatus and an adjacent apparatus.

However, the conventional technique neither involves treatment of the exhaust gas containing an organic solvent containing siloxane discharged to the outside of the clean room nor reduces the burden on the activated carbon filter installed in the aligner or the like described above.

SUMMARY OF THE INVENTION

According to one aspect of the present invention, there is provided: a semiconductor manufacturing system, comprising:

a filter that is disposed in a clean room and removes an organic solvent containing siloxane from a gas supplied from the outside of said clean room;

a first semiconductor manufacturing apparatus that is disposed in said clean room and uses light in an atmosphere containing the gas having passed through said filter;

a second semiconductor manufacturing apparatus that is disposed in said clean room and has an exhaust gas outlet for discharging a gas containing an organic solvent containing siloxane; and a removing device that is disposed at said exhaust gas outlet of said second semiconductor manufacturing apparatus, filters out the organic solvent containing siloxane from the exhaust gas output from said exhaust gas outlet, and discharges the filtered gas into an exhaust gas duct for discharging the exhaust gas to the outside of said clean room.

According to the other aspect of the present invention, there is provided: a semiconductor manufacturing system, comprising:

a semiconductor manufacturing apparatus that has an exhaust gas outlet for discharging a gas containing an organic solvent containing siloxane; and a removing device that is disposed at said exhaust gas outlet of said semiconductor manufacturing apparatus, filters out the organic solvent containing siloxane from the exhaust gas output from said exhaust gas outlet, and discharges the filtered gas.

According to further aspect of the present invention, there is provided: a method of manufacturing a semiconductor device, in a semiconductor manufacturing system having a system in which a removing device disposed at an exhaust gas outlet of a first semiconductor manufacturing apparatus, which is disposed in a clean room and has the exhaust gas outlet for discharging a gas containing an organic solvent containing siloxane, filters out the organic solvent containing siloxane from the exhaust gas output from said exhaust gas outlet, and discharges the filtered gas into an exhaust gas duct for discharging the exhaust gas to the outside of said clean room, comprising:

treating a semiconductor substrate with light in an atmosphere containing a gas having passed through a filter, which is disposed in said clean room for removing the organic solvent containing siloxane from a gas supplied from the outside of said clean room, using a second semiconductor manufacturing apparatus disposed in said clean room.

DETAILED DESCRIPTION

In the following, an embodiment of the present invention will be described with reference to the drawings.

Embodiment

Figure 1:
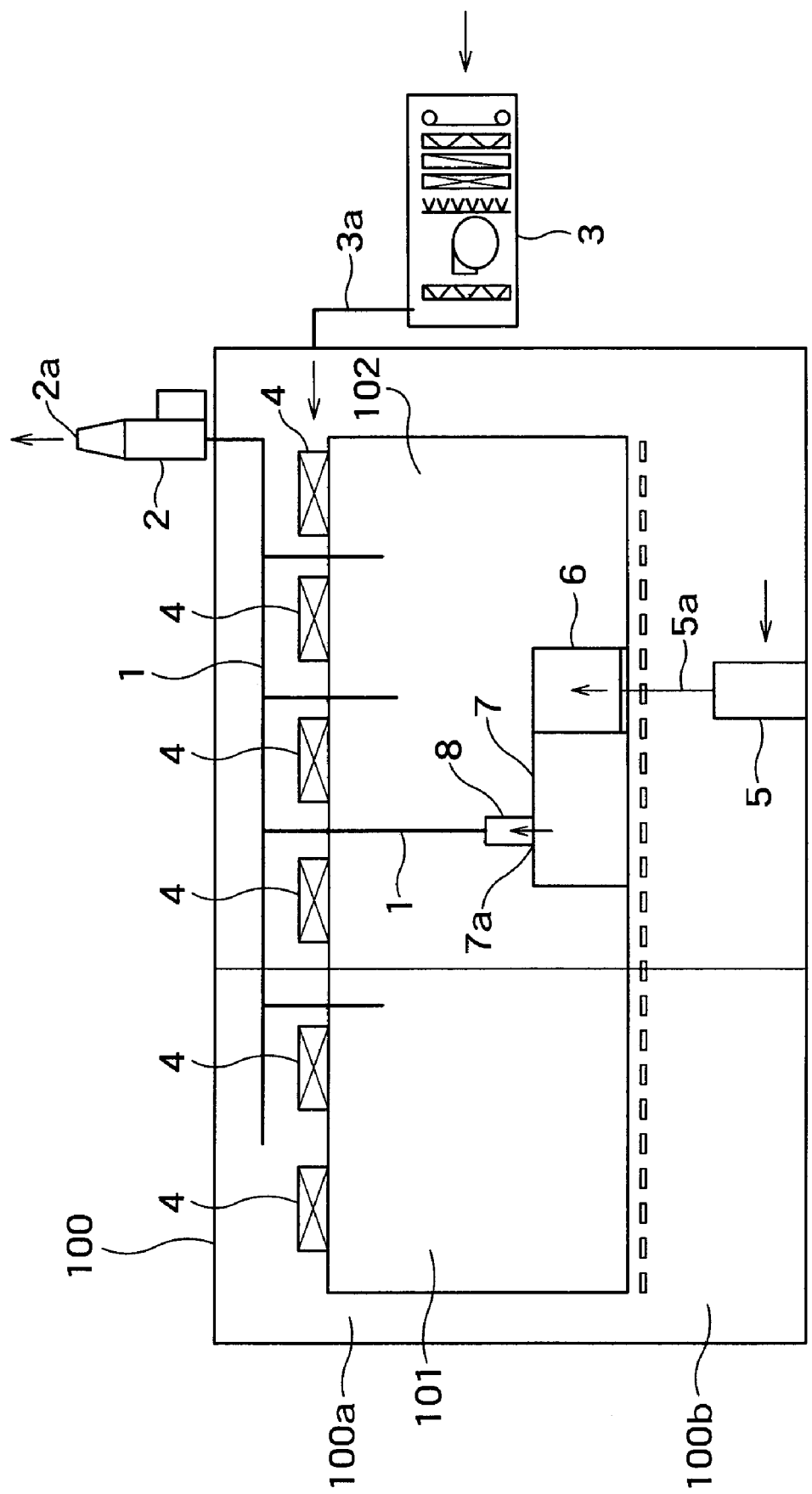
FIG. 1 is a diagram showing a configuration including a semiconductor manufacturing system according to an embodiment of the present invention, which is an aspect of the present invention.

FIG. 1 is a diagram showing a configuration including a semiconductor manufacturing system according to an embodiment of the present invention, which is an aspect of the present invention.

As shown in FIG. 1, a clean room 100 is divided into a clean room fab floor 100a and a clean room sub-fab floor 100b, for example. The clean room fab floor 100a is further divided into a general clean room 101 and a lithography clean room 102, for example.

In the clean room 100, there is provided an exhaust gas duct 1 for discharging gas (exhaust gas) containing an organic matter, such as an organic solvent, to the outside of the clean room 100. The exhaust gas duct 1 is connected to a scrubber 2, which is installed outside of the clean room 100, at an exhaust end thereof. The gas containing an organic matter, such as an organic solvent, in the clean room 100 is filtered through the scrubber 2 to some extent and then discharged to the outside of the clean room 100 through an exhaust gas outlet 2a.

In addition, an outside air conditioner 3 is installed outside of the clean room 100. The outside air conditioner 3 filters out impurities from the atmospheric air and supplies the filtered air into the clean room 100 as makeup air through an intake duct 3a.

In addition, particle filters 4 are installed on the ceiling of the general clean room 101 and the lithography clean room 102. The particle filters 4 remove particles from the gas flowing into the general clean room 101 and the lithography clean room 102.

In the clean room sub-fab floor 100b, there is installed a filter 5 that removes an organic solvent containing siloxane from the gas supplied from the outside of the clean room 100 through the outside air conditioner 3. The filter 5 may be a chemical filter or an activated carbon filter.

In addition, in the general clean room 101, a semiconductor manufacturing apparatus (not shown) or the like, such as an ashing apparatus and an ion implantation apparatus, is disposed.

In addition, the gas having passed through the filter 5 is supplied into the lithography clean room 102 through a duct 5a, and a first semiconductor manufacturing apparatus 6 that uses light in the atmosphere containing the gas is disposed in the lithography clean room 102. The first semiconductor manufacturing apparatus 6 may be an aligner that irradiates a resist applied on a semiconductor wafer with a laser beam of ultraviolet light or the like for exposure or an inspection apparatus that inspects a pattern or reticle formed on a semiconductor wafer, for example.

In addition, in the lithography clean room 102, there is installed a second semiconductor manufacturing apparatus 7 that has an exhaust gas outlet for discharging gas containing an organic solvent containing siloxane. The second semiconductor manufacturing apparatus 7 may be a resist applying apparatus for applying a resist to a semiconductor wafer, for example.

For example, a semiconductor substrate is treated by the second semiconductor manufacturing apparatus 7 before treating a semiconductor substrate with light using the first semiconductor manufacturing apparatus 6.

The second semiconductor manufacturing apparatus 7 has a removing device 8 disposed at an exhaust gas outlet 7a thereof. The removing device 8 is connected to an intake end of the exhaust gas duct 1 at the output end thereof. The removing device 8 filters out an organic solvent containing siloxane from the exhaust gas output from the exhaust gas outlet 7a and discharges the filtered gas into the exhaust gas duct 1. The removing device 8 may be a scrubber, for example.

The processing flow rate per unit time of the removing device 8 is on the order of 0.3 $m^3$/min, for example. On the other hand, the processing flow rate per unit time of the scrubber 2 installed outside of the clean room 100 is on the order of 300 $m^3$/min, for example.

Now, a configuration of the removing device 8 will be described.

Figure 2:
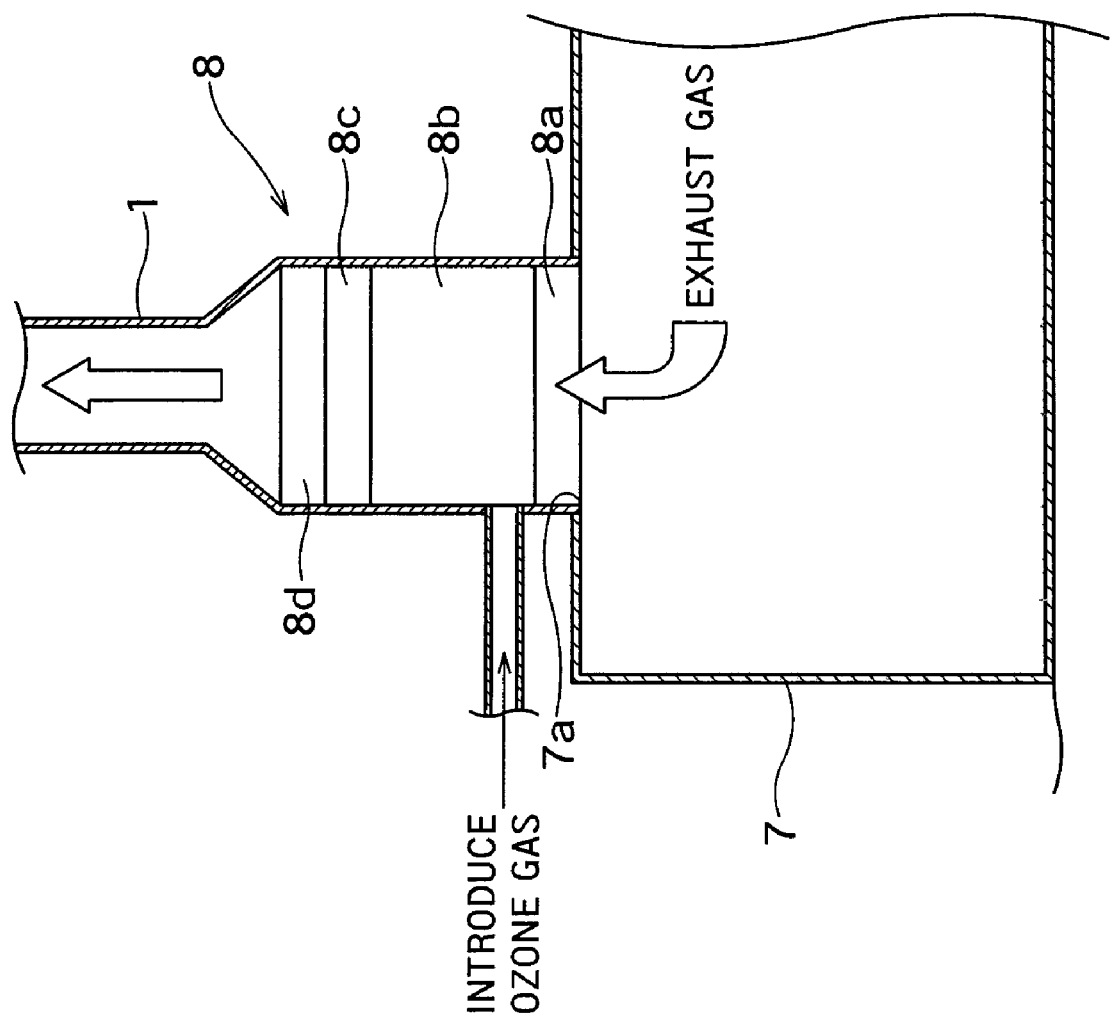
FIG. 2 is a diagram showing essential parts including the removing device 8 of the semiconductor manufacturing system 100 shown in FIG. 1.

FIG. 2 is a diagram showing essential parts including the removing device 8 of the semiconductor manufacturing system 100 shown in FIG. 1.

As shown in FIG. 2, the removing device 8 has a first silicon dioxide removing filter 8a, a decomposing chamber 8b, an ozone decomposing filter 8c, and a second silicon dioxide removing filter 8d.

The first silicon dioxide removing filter 8a is disposed between the exhaust gas outlet 7a and the decomposing chamber 8b. The first silicon dioxide removing filter 8a serves as a filter for removing silicon dioxide.

As the first silicon dioxide removing filter 8a, a particulate filter (an HEPA filter or a medium efficiency filter having a lower collection efficiency than the HEPA filter, for example) is used.

In particular, the first silicon dioxide removing filter 8a is preferably a pleated filter that has a low pressure loss. Furthermore, the filter is made of a glass fiber, for example.

If the organic solvent containing siloxane is in the gas state, the first silicon dioxide removing filter 8a cannot remove the organic solvent.

The decomposing chamber 8b is configured to cause decomposition of siloxane in the exhaust gas output from the exhaust gas outlet 7a by the reaction with ozone and discharges the gas resulting from the reaction. The reaction of siloxane with ozone produces $SiO_2$ (solid).

The first silicon dioxide removing filter 8a prevents $SiO_2$ (solid) produced by the reaction from flowing back into the second semiconductor manufacturing apparatus 7.

The second silicon dioxide removing filter 8d serves as a filter for removing silicon dioxide from the gas discharged from the decomposing chamber 8b.

As with the first silicon dioxide removing filter 8a, as the second silicon dioxide removing filter 8d, a particulate filter (an HEPA filter or a medium efficiency filter having a lower collection efficiency than the HEPA filter, for example) is used.

In particular, the second silicon dioxide removing filter 8d is preferably a pleated filter that has a low pressure loss. Furthermore, the filter is made of a glass fiber, for example.

The ozone decomposing filter 8c is disposed between the decomposing chamber 8b and the second silicon dioxide removing filter 8d. The ozone decomposing filter 8c serves as a filter that filters out ozone from the gas discharged from the decomposing chamber 8b by decomposition. The ozone decomposing filter 8c uses manganese dioxide as a catalyst to decompose ozone, for example.

The ozone decomposing filter 8c removes the ozone remaining after the reaction in the decomposing chamber 8b from the exhaust gas.

The ozone decomposing filter 8c may be disposed between the second silicon dioxide removing filter 8d and the exhaust gas duct 1.

The removing device 8 configured as described above removes siloxane from the exhaust gas output from the exhaust gas outlet 7a.

Figure 3:
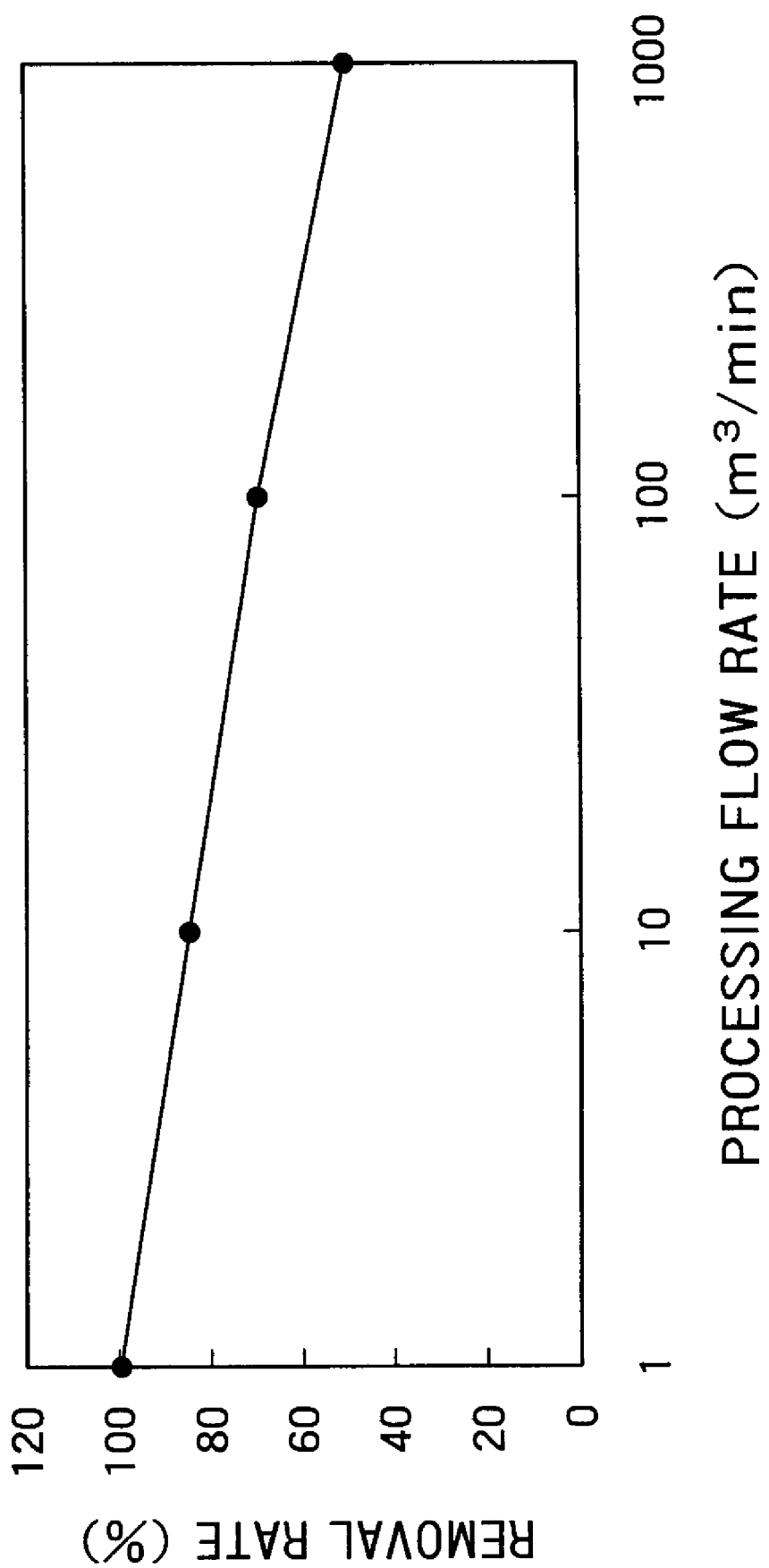
FIG. 3 is a graph showing the TMS removal rate versus the processing flow rate per unit time of the scrubber.

FIG. 3 is a graph showing the TMS removal rate versus the processing flow rate per unit time of the scrubber.

As shown in FIG. 3, the TMS removal rate increases as the processing flow rate per unit time of the scrubber decreases.

Since the processing flow rate of the removing device 8 is greater than the processing flow rate of the scrubber 2, it can be considered that the removal efficiency of the removing device 8 is higher than the removal efficiency of the scrubber 2.

In addition, for example, the concentration of the organic solvent containing siloxane is higher in the vicinity of the exhaust gas outlet of the resist applying apparatus, which is the second semiconductor manufacturing apparatus 7, than at the exhaust end of the exhaust gas duct 1.

From these facts, it can be considered that the removing device 8 disposed at the exhaust gas outlet 7a of the second semiconductor manufacturing apparatus 7 improves the efficiency of removal of the organic solvent containing siloxane.

For the sake of simplicity, FIG. 1 shows a single first semiconductor manufacturing apparatus 6 and a single second semiconductor manufacturing apparatus 7. However, typically, a plurality of first semiconductor manufacturing apparatus 6 and a plurality of second semiconductor manufacturing apparatus 7 are installed. In the case where a plurality of first and second semiconductor manufacturing apparatus are installed, for example, one removing device 8 can be provided for each second semiconductor manufacturing apparatus 7, and the exhaust gas from the plurality of second semiconductor manufacturing apparatus 7 can be collectively treated.

The filter 5 may be incorporated in the aligner or inspection apparatus, which is the first semiconductor manufacturing apparatus 6.

The removing device 8 may be configured to use at least any of a liquid or solid adsorbent, ultraviolet light and a catalyst to filter out the organic solvent from the exhaust gas that can contain the organic solvent containing siloxane, rather than being configured to use the scrubber as described above.

Also in the case where at least any of a liquid or solid adsorbent, ultraviolet light and a catalyst is used, the TMS removal rate exhibits the same tendency as in the case where the scrubber is used as shown in FIG. 3, and the same advantages can be expected.

With the semiconductor manufacturing system according to this embodiment, the TMS concentration of the gas is reduced to the level of several ppb at the exhaust gas outlet of the resist applying apparatus (the outlet of the removing device), to the level of several tens ppb or lower at the exhaust gas outlet of the outside scrubber and to the level of several tens ppt to sub-ppb at the output of the outside air conditioner.

Furthermore, the TMS concentration of the gas supplied to the aligner is several ppt to several tens ppt or lower, and the deterioration in illuminance (haze) is substantially reduced.

Furthermore, the life of the activated carbon filter becomes longer, and the frequency of filter replacement is reduced. As a result, the availability ratio of the aligner is improved.

As described above, the semiconductor manufacturing system according to this embodiment removes the organic solvent containing siloxane more efficiently.

What is claimed is:

1. A semiconductor manufacturing system, comprising:
    a filter that is disposed in a clean room and removes an organic solvent containing siloxane from a gas supplied from the outside of said clean room;
    a first semiconductor manufacturing apparatus that is disposed in said clean room, which is an aligner or an inspection apparatus, and which uses light in an atmosphere containing the gas having passed through said filter;
    a second semiconductor manufacturing apparatus that is disposed in said clean room, which is a resist applying apparatus, and which has an exhaust gas outlet for discharging a gas containing an organic solvent containing siloxane; and
    a removing device that is disposed at said exhaust gas outlet of said second semiconductor manufacturing apparatus, filters out the organic solvent containing siloxane from the exhaust gas output from said exhaust gas outlet, and discharges the filtered gas into an exhaust gas duct for discharging the exhaust gas to the outside of said clean room.

2. The semiconductor manufacturing system according to claim 1, wherein said removing device uses at least any of a liquid or solid adsorbent, ultraviolet light and a catalyst to filter out said organic solvent from the exhaust gas that can contain the organic solvent containing siloxane.

3. A method of manufacturing a semiconductor device, in a semiconductor manufacturing system having a system in which a removing device disposed at an exhaust gas outlet of a first semiconductor manufacturing apparatus, which is disposed in a clean room and has the exhaust gas outlet for discharging a gas containing an organic solvent containing siloxane, filters out the organic solvent containing siloxane from the exhaust gas output from said exhaust gas outlet, and discharges the filtered gas into an exhaust gas duct for discharging the exhaust gas to the outside of said clean room, comprising:
    treating a semiconductor substrate with light in an atmosphere containing a gas having passed through a filter, which is disposed in said clean room for removing the organic solvent containing siloxane from a gas supplied from the outside of said clean room, using a second semiconductor manufacturing apparatus disposed in said clean room,
    wherein said first semiconductor manufacturing apparatus is a resist applying apparatus, and said second semiconductor manufacturing apparatus is an aligner or an inspection apparatus.

4. The method of manufacturing a semiconductor device according to claim 3, wherein said removing device comprises:
  a decomposing chamber that decomposes siloxane contained in the exhaust gas output from said exhaust gas outlet by the reaction with ozone and discharges the gas resulting from the reaction;
  a first silicon dioxide removing filter disposed between said exhaust gas outlet and said decomposing chamber for removing silicon dioxide; and
  a second silicon dioxide removing filter that removes silicon dioxide from the gas discharged from said decomposing chamber.

5. The method of manufacturing a semiconductor device according to claim 4, wherein said removing device further comprises:
  an ozone decomposing filter that filters out ozone from the gas discharged from said decomposing chamber by decomposition.

6. The method of manufacturing a semiconductor device according to claim 5, wherein said ozone decomposing filter is disposed between said decomposing chamber and said second silicon dioxide removing filter.

7. The method of manufacturing a semiconductor device according to claim 3, wherein a semiconductor substrate is treated by said first semiconductor manufacturing apparatus before treating a semiconductor substrate with light using said second semiconductor manufacturing apparatus.

* * * * *